United States Patent
Hong

(10) Patent No.: US 7,681,519 B2
(45) Date of Patent: Mar. 23, 2010

(54) APPARATUS FOR COATING A PHOTORESIST LAYER

(75) Inventor: Chang Young Hong, Gyeonggi-do (KR)

(73) Assignee: Dongbu HiTek Ltd., Co., Seoul (KR)

( * ) Notice: Subject to any disclaimer, the term of this patent is extended or adjusted under 35 U.S.C. 154(b) by 437 days.

(21) Appl. No.: 11/613,084

(22) Filed: Dec. 19, 2006

(65) Prior Publication Data
US 2007/0141254 A1    Jun. 21, 2007

(30) Foreign Application Priority Data
Dec. 20, 2005    (KR) .................. 10-2005-0126329

(51) Int. Cl.
*B05C 13/00*    (2006.01)
*B05C 11/02*    (2006.01)
(52) U.S. Cl. .......................... 118/52; 118/58
(58) Field of Classification Search ............ None
See application file for complete search history.

(56) References Cited

U.S. PATENT DOCUMENTS

| | | | | |
|---|---|---|---|---|
| 5,982,474 A | * | 11/1999 | Akiyama et al. | 355/53 |
| 6,132,802 A | * | 10/2000 | Davis et al. | 438/758 |
| 6,153,361 A | * | 11/2000 | Liu et al. | 430/331 |
| 6,551,765 B1 | * | 4/2003 | Mukai et al. | 430/320 |
| 6,614,507 B2 | * | 9/2003 | Young et al. | 355/67 |
| 2006/0191634 A1 | * | 8/2006 | Whitefield et al. | 156/345.1 |
| 2006/0192283 A1 | * | 8/2006 | Benson | 257/730 |
| 2006/0201423 A1 | * | 9/2006 | Akimoto et al. | 118/712 |
| 2008/0133045 A1 | * | 6/2008 | Hontake et al. | 700/121 |
| 2008/0193654 A1 | * | 8/2008 | Fukuda et al. | 427/372.2 |

* cited by examiner

*Primary Examiner*—Amanda C. Walke
(74) *Attorney, Agent, or Firm*—Sherr & Vaughn PLLC

(57) ABSTRACT

Embodiments relate to an apparatus for coating a photoresist layer and a photolithography method using the apparatus. In embodiments, the apparatus may include a rotatable wafer support for supporting a wafer to be coated with a photoresist layer, a beam nozzle for performing WEE (Wafer Edge Exposure) with respect to a photoresist layer at an edge of the wafer on the wafer support, and a spray nozzle for spraying an alkali solution onto an edge of the wafer exposed through the beam nozzle.

11 Claims, 2 Drawing Sheets

APPARATUS FOR COATING A PHOTORESIST LAYER

The present application claims priority under 35 U.S.C. 119 and 35 U.S.C. 365 to Korean Patent Application No. 10-2005-0126329 (filed on Dec. 20, 2005), which is hereby incorporated by reference in its entirety.

BACKGROUND OF THE INVENTION

A photolithography process for forming patterns may be required to manufacture semiconductor devices.

In a photolithography process, a resist layer may be coated on a target layer to be patterned. An exposure and development process may be performed, thereby forming a patterned resist layer. An etching process may be performed, for example by using the resist layer pattern as a mask. A target layer may thus be patterned.

In a related art photolithography method an adhesive agent or BARC (Bottom Anti Reflective Coating) may be deposited on a wafer, and may increase adhesion between a photoresist layer and a lower layer.

A heating process may then be performed. Edge Bead Remover (EBR) may next be performed while coating the photoresist layer. Beads may refer to photoresist residues remaining at an edge of a wafer.

Wafer Edge Exposure (WEE) may be performed to remove beads at an edge of the wafer.

An exposure and development process may be performed with respect to the coated photoresist layer by using a mask. This may develop a pattern transferred by using a mask and beads exposed at the edge of the wafer through WEE. A photoresist layer pattern transferred with a mask pattern can be obtained through such a series of procedures.

However, according to the related art, the EBR may be performed together with a photoresist layer coating process, and may use a thinner. Since the thinner drops on an inner surface of a wafer in this procedure, the thinner may melt an otherwise normally formed photoresist layer, which may result in pattern failure.

Further, according to the related art, only one unit is generally used for track equipment due to the size of the unit in a separately performed WEE process. Therefore, the entire process speed is delayed and a product yield may be lowered.

SUMMARY

Embodiments relate to a photo process. Embodiments relate to an apparatus for coating a photoresist layer and a photolithography method using the apparatus.

Embodiments relate to an apparatus for coating a photoresist layer, wherein a thinner is not used to perform EBR in a photoresist layer coating process so that pattern failure due to the thinner may be prevented in advance, and a photolithography method using the apparatus.

Embodiments relate to an apparatus for coating a photoresist layer, wherein WEE and EBR are performed together so that productivity may be enhanced, and a photolithography method using the apparatus.

In embodiments, an apparatus for coating a photoresist layer may include a rotatable wafer support for supporting a wafer to be coated with a photoresist layer, a beam nozzle for performing WEE (Wafer Edge Exposure) with respect to a photoresist layer at an edge of the wafer on the wafer support, and a spray nozzle for spraying an alkali solution onto an edge of the wafer exposed through the beam nozzle.

In embodiments, a photolithography method may include seating a wafer on a wafer support of an apparatus for coating a photoresist layer, coating a photoresist layer while rotating the wafer support having the wafer seated thereon, irradiating a beam onto edges of top and bottom surfaces of the wafer coated with the photoresist layer, thereby performing WEE such that photoresists at edges of the top and bottom surfaces of the wafer are primarily removed, spraying an alkali solution onto edges of the top and bottom surfaces of the wafer, thereby secondarily removing photoresists at edges of the top and bottom surfaces of the wafer, performing an exposure process using a mask with the photoresist layer coated on the wafer having the photoresists removed at the edges thereof, and developing the photoresist layer exposed through the exposure process by using the mask.

DETAILED DESCRIPTION OF EMBODIMENTS

Figure 1:
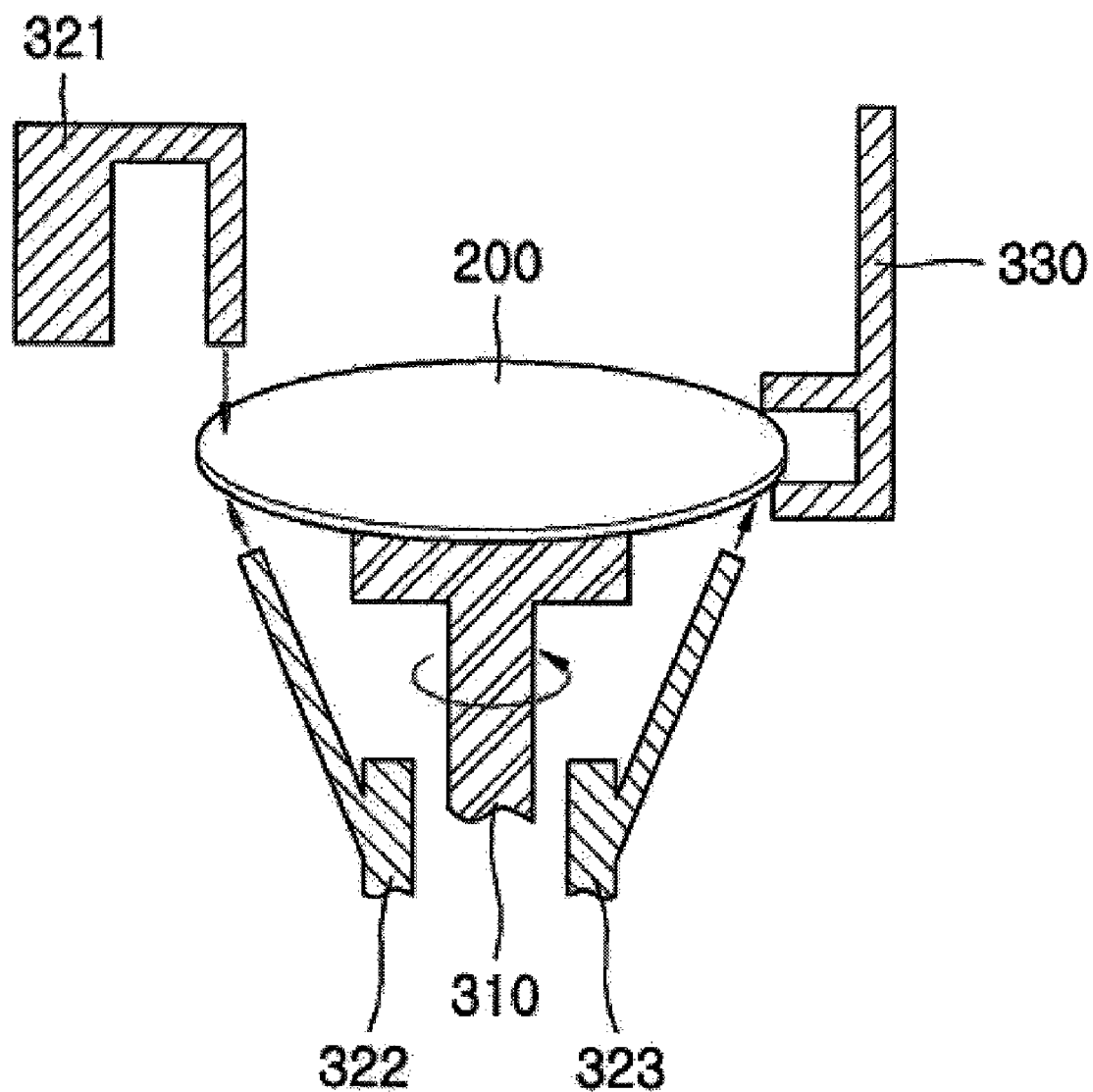
FIG. 1 is an example schematic diagram of an apparatus for coating a photoresist layer according to embodiments.
Figure 2:
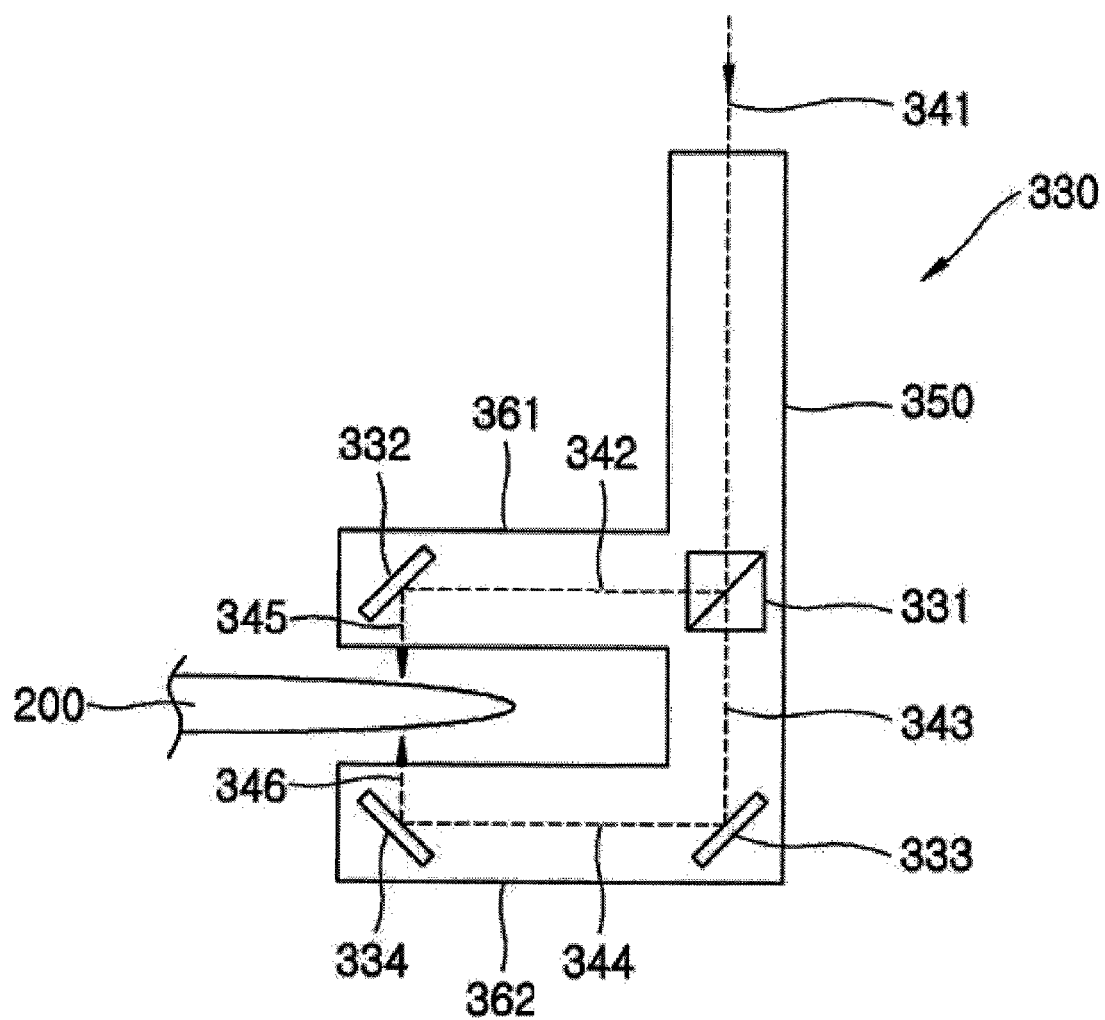
FIG. 2 is an example diagram illustrating a beam nozzle for WEE in the apparatus for coating a photoresist layer according to embodiments.

Referring to FIGS. 1 and 2, the apparatus for coating a photoresist layer, according to embodiments, may include wafer support 310. Wafer support may support wafer 200 that may be coated with a photoresist layer. Spray nozzles 321, 322 and 323 may also be provided and may spray an alkali solution to remove beads at an edge of wafer 200. Beam nozzle 330 may also be provided and may perform an exposure process with respect to a photoresist layer at an edge of wafer 200.

Wafer support 310 may be rotated, and wafer 200 may be accordingly be simultaneously rotated.

A spin coating technique may be used to coat a photoresist layer. For example, a photoresist may be dripped on a top surface of wafer 200 while rotating wafer 200 and the photoresist layer may be uniformly coated on wafer 200 due to a centrifugal force.

Beam nozzle 330 may be used to perform WEE, and may be positioned such that a beam may irradiate onto edges of top and bottom surfaces of wafer 200.

In embodiments, beam nozzle 330 may include main beam nozzle 350, and first and second auxiliary nozzles, as shown in FIG. 2.

Main beam nozzle 350 may be positioned to correspond to a path of beam 341 irradiated from a beam source. Beam splitter 331 may be positioned at a center of main beam nozzle 350. Beam 341 incident along main beam nozzle 350 on a first beam path by beam splitter 331 may be split into second beam 342 advancing along the first auxiliary nozzle 361 on a second beam path and first beam 343 continuously advancing along main beam nozzle 350 on the first beam path.

According to embodiments, beam splitter 331 may split the beam on the first beam path by 50% into first beam 343 on the first beam path and the second beam 342 on the second beam path.

Further, first beam 343 on the first beam path and the second beam 342 on the second beam path may be perpendicular to each other.

Second beam 342 advancing along first auxiliary nozzle 361 on the second beam path may be changed into second beam 345 advancing toward an edge of the top surface of wafer 200 on a beam path by first mirror 332. For example, first mirror 332 may change a beam path such that second beam 342 on the second beam path may be vertically irradiated onto wafer 200.

Further, beam 343 passing through beam splitter 331 and continuously advancing on the first beam path may be changed into first beam 344 advancing along second auxiliary nozzle 362 on a third beam path by second mirror 333. According to embodiments, first beam 344 on the third beam path may be parallel with second beam 342 on the second beam path.

First beam 344 on the third beam path may be changed into first beam 346 advancing toward an edge of the bottom surface of wafer 200 by third mirror 334. For example, third mirror 334 may change a beam path such that first beam 344 on the third beam path may be vertically irradiated onto wafer 200.

Through such a beam irradiation scheme according to embodiments, a beam may be irradiated onto edges of top and bottom surfaces of a photoresist layer on wafer 200 and WEE may be accomplished.

Spray nozzles 321, 322, and 323 may be used to perform EBR, and may include first spray nozzle 321 for spraying an alkali solution onto an edge of the top surface of wafer 200, and second and third spray nozzles 322 and 323 for spraying an alkali solution onto edges of the bottom surface of wafer 200 while being positioned in opposition to each other.

According to embodiments, third spray nozzle 323 may be positioned at a place where beam nozzle 330 is positioned, and second spray nozzle 322 may be positioned opposite to the place where beam nozzle 330 is positioned.

According to embodiments, a developer for a positive photoresist may be used as the alkali solution. For example, the alkali solution may include TMAH (TETRA METHYL AMMONIUM HYDROXIDE) or NaOH.

According to embodiments, the apparatus may further include a washing solution nozzle (not shown) for spraying a washing solution while spraying the alkali solution. According to embodiments, there may be an advantage in that Xylene Stoddard's Solvent may be sprayed as the washing solution so that the alkali solution may be prevented from being dried.

According to embodiments, an apparatus for coating a photoresist layer may have various advantages. For example WEE and EBR using an alkali solution may be performed together while applying a photoresist layer, and may remove a photoresist at an edge of a wafer at one time. Damage to a photoresist layer from use of a thinner may thereby be prevented.

Further, according to embodiments, there may be an advantage in that WEE and EBR processes may be performed together in a lithography process. This may increase a rate of manufacture by eliminating a bottle neck in the WEE process. A yield may thereby be increased.

A photolithography method using an apparatus for coating a photoresist layer according to embodiments will be described below.

First, wafer 200 may be seated on wafer support 310. Further, an adhesive agent or BARC may be coated on wafer 200.

A photoresist layer may then be coated while rotating wafer support 310 having wafer 200 seated thereon. Simultaneously, WEE for irradiating a beam onto edges of top and bottom surfaces of wafer 200 may be performed, for example using beam nozzle 330. Photoresist residues may be primarily removed.

Accordingl to embodiments, an alkali solution may be sprayed onto edges of the top and bottom surfaces of wafer 200 by using spray nozzles 321, 322 and 323. Photoresist residues exposed at the edges of the top and bottom surfaces of wafer 200 may thereby be secondarily removed.

According to embodiments, the method may further include spraying a washing solution while spraying the alkali solution. For example, according to embodiments, a solution such as Xylene Stoddard's Solvent may be sprayed as the washing solution. Thus a drying of the alkali solution may be prevented.

Then, a general exposure process may be performed with respect to the coated photoresist layer, for example by using a mask. Further, a development process may be performed to develop a pattern transferred by using a mask. A photoresist layer pattern transferred with a mask pattern may be obtained through such a series of procedures.

According to embodiments, a photolithography method may have various advantages. For example, WEE and EBR using an alkali solution may be performed together while coating a photoresist layer. Damage to a photoresist layer from use of a thinner may therefore be prevented.

Further, according to embodiments, WEE and EBR processes may be performed together in a lithography process, thereby reducing or eliminating a bottle neck in a WEE process. A yield may thereby be increased.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. An apparatus comprising:
   a rotatable wafer support configured to support a wafer;
   a beam nozzle configured to perform Wafer Edge Exposure (WEE) with respect to a photoresist layer at an edge of the wafer; and
   a spray nozzle configured to spray an alkali solution onto the edge of the wafer exposed using the beam nozzle,
   wherein the spray nozzle comprises a first spray nozzle configured to spray the alkali solution onto the edge of a top surface of the wafer, a second spray nozzle positioned substantially opposite of a location of the beam nozzle and configured to spray the alkali solution onto the edge of a bottom surface of the wafer at a first location, and a third spray nozzle positioned substantially adjacent to the beam nozzle and configured to spray the alkali solution onto the edge of the bottom surface of the wafer at a second location approximately 180° rotated from the first location.

2. The apparatus of claim 1, wherein the rotatable wafer support is configured to support a wafer to be coated with a photoresist layer.

3. The apparatus of claim 1, wherein the beam nozzle is positioned to irradiate a beam supplied from a beam source onto the edge of top and bottom surfaces of the wafer.

4. The apparatus of claim 3, wherein the beam nozzle comprises:
   a beam splitter configured to split the beam irradiated from the beam source on a first beam path into a first beam on the first beam path and a second beam on a second beam path;
   a first mirror configured to redirect the second beam to be irradiated onto the edge of a top surface of the wafer;
   a second mirror configured to redirect the first beam to be substantially parallel to the second beam; and a third mirror configured to redirect the first beam to be irradiated onto the edge of a bottom surface of the wafer.

5. The apparatus of claim 4, wherein the beam splitter splits the beam by equal portions into the first beam on the first beam path and the second beam on the second beam path.

6. The apparatus of claim 4, wherein the first beam path and the second beam path are substantially perpendicular to each other.

7. The apparatus of claim 4, wherein the first mirror redirects the second beam to be substantially vertically irradiated onto the wafer.

8. The apparatus of claim 4, wherein the third mirror redirects the first beam to be substantially vertically irradiated onto the wafer.

9. The apparatus of claim 1, wherein the alkali solution comprises TMAH (TETRA METHYL AMMONIUM HYDROXIDE).

10. An apparatus comprising:
a beam nozzle configured to perform Wafer Edge Exposure (WEE) with respect to a photoresist layer at an edge of top and bottom surfaces of a wafer and positioned to irradiate a beam supplied from a beam source onto the edge of the top and the bottom surfaces of the wafer; and
a plurality of spray nozzles configured to spray an alkali solution onto the edge of the wafer exposed using the beam nozzle and configured to perform an Edge Bead Removal process simultaneously with the WEE,
wherein the beam nozzle comprises a beam splitter configured to split the beam irradiated from the beam source on a first beam path into a first beam on the first beam path and a second beam on a second beam path, a first mirror configured to redirect the second beam to be irradiated onto the edge of a top surface of the wafer, a second mirror configured to redirect the first beam to be substantially parallel to the second beam, and a third mirror configured to redirect the first beam to be irradiated onto the edge of a bottom surface of the wafer.

11. The apparatus of claim 10, wherein the beam nozzle is configured to provide a first beam to the top surface of the wafer and a second beam to the bottom surface of the wafer, and wherein the plurality of spray nozzles comprises first, second, and third spray nozzles to spray the alkali solution onto the top and bottom surfaces of the wafer.

* * * * *